United States Patent [19]
Hirata

[11] Patent Number: 5,373,293
[45] Date of Patent: Dec. 13, 1994

[54] MIXED ANALOG/DIGITAL MIXED INTEGRATED CIRCUIT HAVING A DIGITAL CLOCK INHIBIT

[75] Inventor: Yasushi Hirata, Kawasaki, Japan

[73] Assignee: Kabushiki Kaisha Toshiba, Kawasaki, Japan

[21] Appl. No.: 876,093

[22] Filed: Apr. 30, 1992

[30] Foreign Application Priority Data

Apr. 30, 1991 [JP] Japan .................................. 3-098823

[51] Int. Cl.⁵ ........................................... H03M 1/06
[52] U.S. Cl. ................................... 341/118; 341/155
[58] Field of Search ............................... 341/155, 118

[56] References Cited

U.S. PATENT DOCUMENTS

| | | | |
|---|---|---|---|
| 4,303,880 | 12/1981 | Munt et al. | 341/118 |
| 4,544,914 | 10/1985 | Chan et al. | 341/155 |
| 4,982,193 | 1/1991 | Saul | 341/159 |
| 4,990,912 | 2/1991 | Selwa | 341/132 |
| 5,103,462 | 4/1992 | Elle et al. | 375/22 |

*Primary Examiner*—Marc S. Hoff
*Attorney, Agent, or Firm*—Foley & Lardner

[57] ABSTRACT

In mixed analog/digital integrated circuit constructed by an analog unit, typically an A/D converter, which processes an analog signal and converts it into a digital signal, a digital unit for processing the digital signal, and a clock signal generator for supplying operating clock signals to the analog unit and the digital unit, a clock signal stop circuit for stopping an operating clock signal supplied to the digital unit during an operation of the analog unit is provided, thus adverse effect on the analog unit by the digital noise generated by the digital unit is eliminated.

4 Claims, 3 Drawing Sheets

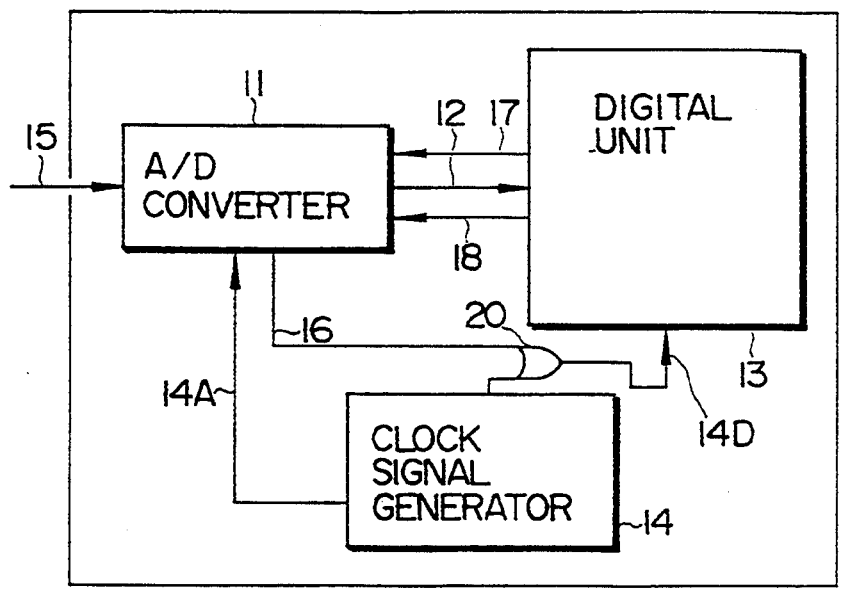
F I G. 1
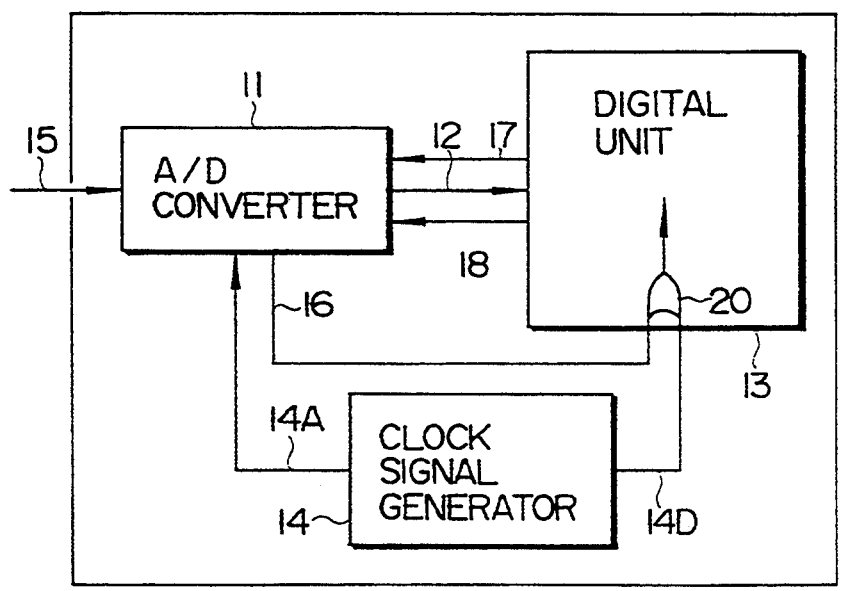
F I G. 2

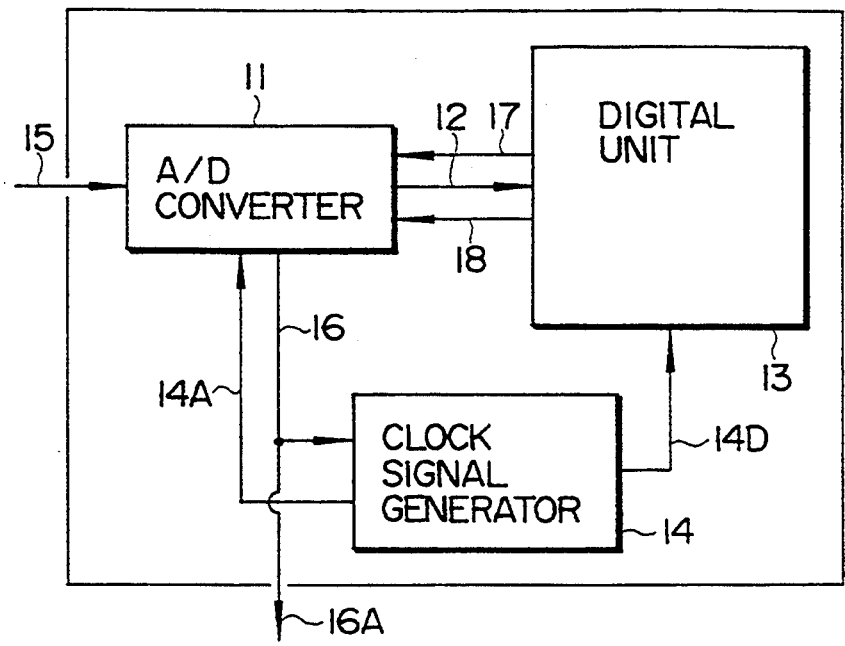
F I G. 3
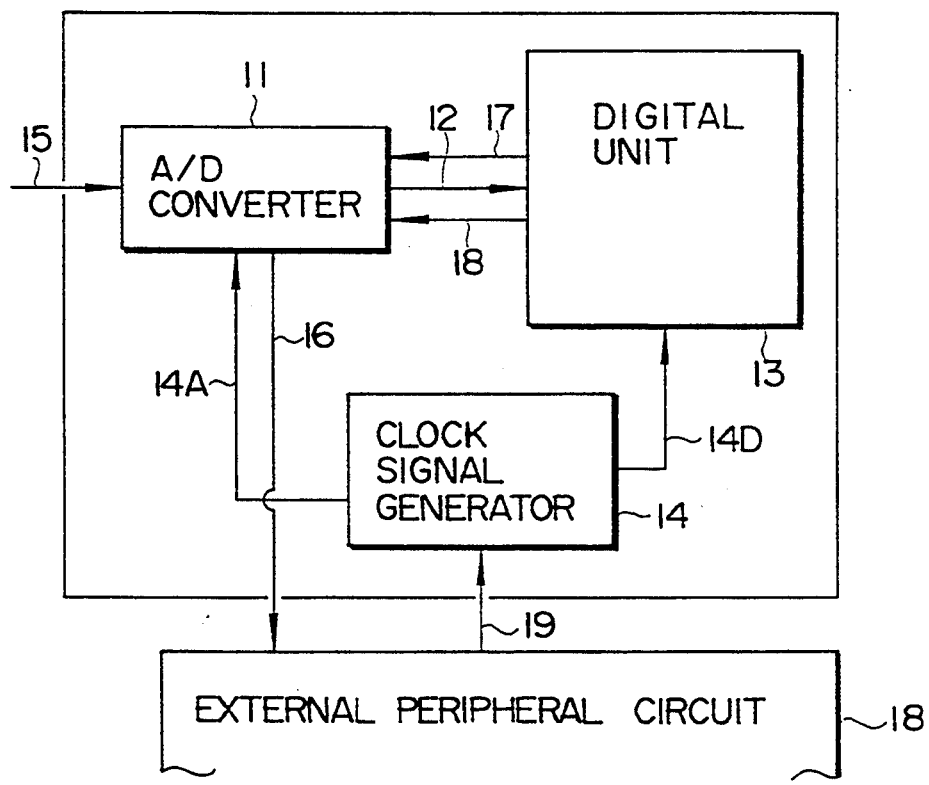
F I G. 4

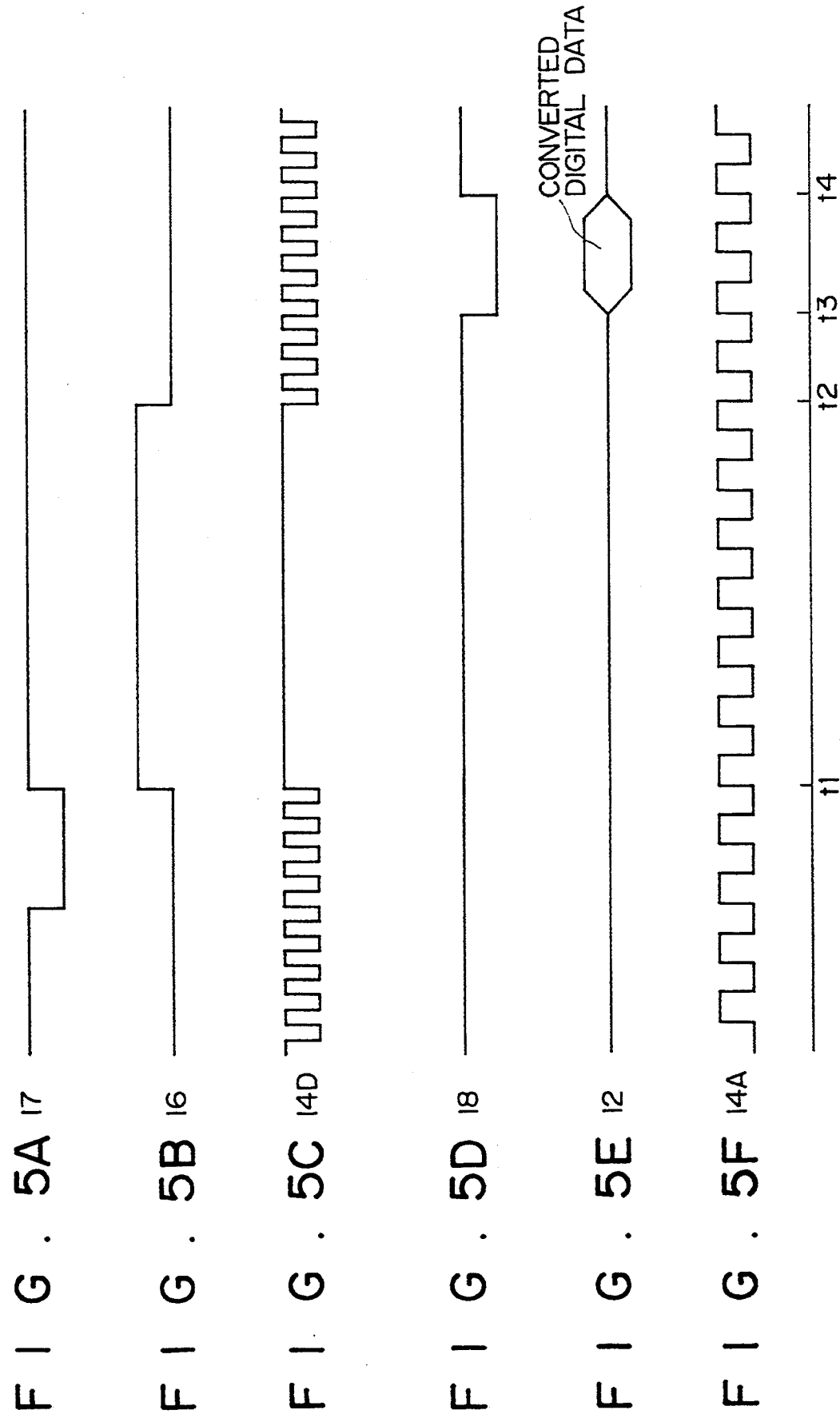

MIXED ANALOG/DIGITAL MIXED INTEGRATED CIRCUIT HAVING A DIGITAL CLOCK INHIBIT

BACKGROUND OF THE INVENTION

This invention relates to a mixed analog/digital mixed integrated circuit wherein a circuit for processing of an analog signal and a circuit for processing of a digital signal are mixed or coexist.

A conventional analog/digital mixed integrated circuit has an analog unit which processes an analog signal inputted through an analog input signal line and converts the analog signal into a digital signal, a digital unit which is connected to the analog unit through a signal line and processes a digital signal, and a clock signal generator which supplies an analog unit operation clock signal for the analog unit and a clock signal for the digital unit.

In this circuit construction, the clock signal generator always generates the analog unit operation clock signal and the digital unit operation clock signal so that even when the analog unit is now processing an input signal, the digital unit, operation clock signal is always supplied to the digital unit for causing it to operate. For this reason, digital noise generated by the digital unit adversely affects the processing at the analog unit resulting in a problem of decreasing the accuracy of processing of the analog unit. In this case, when a signal is processed in the digital unit using a digital signal which has been converted at the analog unit having a decreased accuracy, certain corrections must be made. Moreover, the time required for making these correction becomes long as the number of analog/digital converted data increases.

SUMMARY OF THE INVENTION

It is therefore an object of this invention to provide an analog/digital mixed integrated circuit capable of improving the accuracy of processing of the analog unit.

It is another object of the invention to provide an analog/digital mixed integrated circuit capable of decreasing digital noise caused by the operation of the digital unit, thereby improving and stabilizing the accuracy of the analog unit.

According to this invention, there is provided an analog/digital mixed integrated circuit having analog signal processing means for processing an analog signal and converting it into a digital signal, digital signal processing means for processing the digital signal, clock signal generating means for supplying operating clock signals to the analog signal processing means and the digital signal processing means, and clock signal stop means for stopping an operating clock signal supplied to the digital signal processing means during operation of the analog unit.

The clock signal stop means preferably stops supply of the clock signal to the-digital signal processing means from the clock signal generating means upon receiving of a signal indicating that the analog signal processing means is operating.

The clock signal stop means is preferably installed in the digital signal processing means.

The signal indicating that the analog signal processing means is operating is also applied to an external circuit for stopping it.

According to the present invention, since there is provided clock signal stopping means for stopping a clock signal for stopping the operation of the digital signal operation means by a signal indicating that the analog signal processing means is now operating during the operation of the analog signal processing means, it is possible to decrease the digital noise generated by the operation of the digital signal processing means thereby improving and stabilizing the accuracy of the analog signal processing means.

BRIEF DESCRIPTION OF THE DRAWING

In the accompanying drawings:

FIG. 1 is a block diagram showing a first embodiment of the present invention;

FIG. 2 is a block diagram showing a second embodiment of the present invention;

FIG. 3 is a block diagram showing a third embodiment of the present invention;

FIG. 4 is a block diagram showing a fourth embodiment of the present invention; and FIGS. 5A–5F are timing charts showing the operation of the analog/digital mixed integrated circuit according to the present invention.

DESCRIPTION OF THE PREFERRED EMBODIMENT

In the first embodiment of this invention shown in FIG. 1, an analog to digital converter (A/D converter) 11 which converts an analog input signal 15 into a digital signal 12 is provided as an analog unit. A digital unit 13 gives the A/D converter 11 A/D conversion start signal 17 to perform A/D conversion and also gives the A/D converter 11 A/D converted data output control signal 18 to receive digital signals 12 to perform digital processing. A clock signal generator 14 generates a clock signal 14A for operating the A/D converter 11 and a clock signal 14D for operating the digital unit 13. Furthermore, the A/D converter 11 transmits to one terminal of an OR gate which constitutes a clock signal stop means an A/D busy signal 16 showing that the A/D converter 11 is now executing a conversion operation.

The operation of such construction is explained with reference to a timing chart shown in FIG. 5A–5F.

At timing t1, the A/D conversion start signal 17 is supplied to the A/D converter 11, A/D converter performs A/D conversion of the inputted analog signal 15. At that time, since the A/D busy signal 16 representing that the conversion operation is now proceeding is supplied to one input terminal of the OR gate 20, no digital operation clock signal 14D is outputted from the OR gate 20 even if an output signal from the clock signal generation 14 is given to the other terminal of the OR gate 20. The clock signal 14A for the A/D converter is continuously applied to the A/D converter 11.

At timing t2, the A/D converter completes A/D conversion and the A/D busy 16 falls down, and the digital operationclock signal 14D is outputted from the OR gate 20. At that time, A/D converted data are stored in a register of the A/D converter 11.

From t3 to t4, A/D converted data output control signal 18 is given to the AD converter 11 from the digital unit 13, and consequently the stored converted digital signal 12 is transmitted to the digital unit 13.

As above described, in the embodiment shown in FIG. 1, since the operation of the digital unit 13 is ceased by stopping the operation signal from the clock signal generator 14 on the basis of the application of an A/D busy signal 16 showing that A/D converter is in operation is in high level so that the digital noise generated by the operation of the digital circuit 13 is decreased thereby increasing the accuracy of the A/D converter 11. As a consequence, the accuracy of the digital signal 12 outputted from the A/D converter is improved whereby no correction processing of the digital unit 13 is necessary.

FIG. 2 shows the second embodiment of the present invention. In FIG. 2 and following drawings, circuit components identical to those shown in FIG. 1 are designated by the same reference numerals and their detailed description is omitted.

In the embodiment shown in FIG. 2, an input stop circuit 17 controlled by the A/D busy signal 16 is incorporated in the digital unit 13 so that by the operation of this input stop circuit, the inputting of the clock signal 14D for operating the digital unit 13 is stopped. As a consequence, irrespective of the operation of the A/D converter 11, the clock signal generating unit 14 outputs the clock signal 14D for operating the digital unit 13 but during the operation of the A/D converter 11 no clock signal 14D is applied to the digital unit 13 so that the digital unit 13 stops to operate. In the embodiment shown in FIG. 2, an OR gate circuit is also used as the input stop circuit 17.

FIG. 3 shows the third embodiment of this invention. In this embodiment, an A/D busy signal 16A is supplied to outside so that not only the digital unit in an integrated circuit, but also an external peripheral circuit, not shown, is stopped to operate so as to further decrease the digital noise.

FIG. 4 shows the fourth embodiment of the present invention. In this embodiment, the A/D busy signal 16 is outputted to an external peripheral circuit 18 and by using a control signal 19 from the external peripheral circuit 18 to the clock signal generating unit 14 for stopping the clock signal 14D generated by the clock signal generating unit 14 and supplied to the digital unit 13 for operating the same. During the cease of the clock signal 14D for operating the digital unit 13, the external peripheral circuit may or may not operate.

As has been described in detail with reference to various embodiments, according to the present invention, since there is provided clock signal stopping means having a simple construction for stopping a clock signal to stop the operation of the digital unit according to a signal indicating that the A/D converter is now operating during the operation of the A/D converter, it is possible to decrease the digital noise generated by the operation of the digital unit thereby improving and stabilizing the accuracy of the analog unit.

What is claimed is:

1. An analog/digital mixed integrated circuit comprising:
   an analog signal processing unit for processing an analog signal and for converting it into a digital signal;
   a digital signal processing unit for processing said digital signal;
   clock signal generating means for supplying operating clock signals to said analog signal processing unit and said digital signal processing unit; and
   clock signal inhibit means for inhibiting the supply of said operating clock signals from said clock signal generating means to said digital signal processing unit to minimize digital noise which would otherwise be generated, said clock signal inhibit means being operative upon receipt of a signal indicating that said analog signal processing unit is in operation.

2. The mixed analog/digital integrated circuit according to claim 1, wherein said clock signal inhibit means is constructed by an OR gate.

3. The mixed analog/digital integrated circuit according to claim 1, wherein said clock signal inhibit means is installed in said digital signal processing unit.

4. The mixed analog/digital integrated circuit according to claim 1, wherein a signal indicating that said analog signal processing unit is operating is also applied to an external circuit for inhibiting said external circuit.

* * * * *